US012755794B2

(12) United States Patent
Huang

(10) Patent No.: US 12,755,794 B2
(45) Date of Patent: Oct. 6, 2026

(54) ARCHITECTURE AND METHOD FOR NAND MEMORY OPERATION

(71) Applicant: YANGTZE MEMORY TECHNOLOGIES CO., LTD., Wuhan (CN)

(72) Inventor: Kaijin Huang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 133 days.

(21) Appl. No.: 18/798,320

(22) Filed: Aug. 8, 2024

(65) Prior Publication Data

US 2024/0395331 A1 Nov. 28, 2024

Related U.S. Application Data

(63) Continuation of application No. 17/215,005, filed on Mar. 29, 2021, now Pat. No. 12,094,538, which is a continuation of application No. PCT/CN2021/070811, filed on Jan. 8, 2021.

(51) Int. Cl.

| | |
|---|---|
| ***G11C 16/16*** | (2006.01) |
| ***G11C 16/04*** | (2006.01) |
| ***G11C 16/10*** | (2006.01) |
| ***G11C 16/14*** | (2006.01) |
| ***G11C 16/26*** | (2006.01) |
| ***G11C 16/34*** | (2006.01) |

(52) U.S. Cl.

CPC .......... *G11C 16/14* (2013.01); *G11C 16/0483* (2013.01); *G11C 16/10* (2013.01); *G11C 16/26* (2013.01); *G11C 16/3445* (2013.01); *G11C 16/16* (2013.01)

(58) Field of Classification Search

CPC .......... G11C 16/14; G11C 16/16; H10B 43/27

See application file for complete search history.

(56) References Cited

U.S. PATENT DOCUMENTS

| | | | | |
|---|---|---|---|---|
| 9,754,672 | B2 * | 9/2017 | Nakai .................... | G11C 16/16 |
| 2008/0158994 | A1 | 7/2008 | Yang | |
| 2009/0290423 | A1 | 11/2009 | Kim et al. | |
| 2012/0218827 | A1 | 8/2012 | Baek | |
| 2014/0226407 | A1 | 8/2014 | Izumi | |

(Continued)

FOREIGN PATENT DOCUMENTS

| | | |
|---|---|---|
| CN | 104051012 A | 9/2014 |
| CN | 106558330 A | 4/2017 |

(Continued)

OTHER PUBLICATIONS

International Search Report Issued on Oct. 12, 2021 in PCT/CN2021/070811, 4 pages.

*Primary Examiner* — Jason Lappas
(74) *Attorney, Agent, or Firm* — BAYES PLLC

(57) ABSTRACT

In a method for erasing a memory device including memory cells, a first erase operation is performed on a selected memory cell of the memory cells. A first erase verifying operation is performed on the selected memory cell. A second erase verifying operation is performed on the selected memory cell. A second erase operation is performed on the selected memory cell based on results of the first erase verifying operation and the second erase verifying operation.

20 Claims, 9 Drawing Sheets

(56) References Cited

U.S. PATENT DOCUMENTS

| | | | | |
|---|---|---|---|---|
| 2018/0130535 | A1 | 5/2018 | Lee | |
| 2019/0378574 | A1 | 12/2019 | Lee et al. | |
| 2020/0111535 | A1 | 4/2020 | Han et al. | |
| 2020/0202963 | A1 * | 6/2020 | Ko | H10B 43/27 |
| 2020/0411105 | A1 | 12/2020 | Lee et al. | |
| 2021/0050066 | A1 | 2/2021 | Han et al. | |

FOREIGN PATENT DOCUMENTS

| | | | |
|---|---|---|---|
| CN | 106971754 | A | 7/2017 |
| CN | 109273039 | A | 1/2019 |
| CN | 111009275 | A | 4/2020 |
| CN | 111951868 | A | 11/2020 |
| EP | 3 579 236 | A1 | 12/2019 |

* cited by examiner

ARCHITECTURE AND METHOD FOR NAND MEMORY OPERATION

CROSS-REFERENCE TO RELATED APPLICATIONS

This application is a continuation of U.S. application Ser. No. 17/215,005, filed on Mar. 29, 2021, which is a continuation of International Application No. PCT/CN2021/070811, filed on Jan. 8, 2021, both of which are hereby incorporated by reference in their entireties.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in micro-computers, automatic control systems, and the like. To increase the bit density and reduce the bit cost of the flash memory devices, three-dimensional (3D) NAND (Not AND) flash memory devices have been developed.

In related examples, a method of erasing memory cells of the 3D-NAND flash memory devices can be an incremental step pulse erase (ISPE) operation. In the ISPE operation, values of erase pulses (also referred to as erase voltages) that are applied to the memory cells can be increased gradually by increasing an ISPE step (also referred to as an incremental voltage), and a verifying operation can be performed after each of the erase pulses. On one hand, in order to reduce erase time, the ISPE step of the erase pulses can be a large value. On the other hand, since the ISPE operation does not have an erase inhibit function, memory cells that pass the verifying operation can continue to be erased until other memory cells pass the erase verifying operation. Thus, the ISPE operation can bring several issues. First, the ISPE operation can cause a deep erasure in some of the memory cells. For example, in order to erase a few of memory cells that fail in a previous verifying operation, a higher erase pulse can be generated, which can cause other memory cells that pass the previous verifying operation to be erased at least one ISPE step deeper than an erase verify level (also referred to as erase verify voltage). The deep erasure can deteriorate wear performances and reliabilities of the memory cells. Secondly, the deep erasure can cause a wider distribution of threshold voltages of the memory cells. Thus, more programming pulses and longer verification time are needed in programming the memory cells, which can lead to longer programming time. Further, when a smaller ISPE step is applied in the ISPE operation to prevent the deep erasure, the erase time can be significantly increased. On the other hand, when a high initial erase voltage is applied to keep the erase time unchanged, the wear performances of the memory cells can be greatly affected.

SUMMARY

In the present disclosure, embodiments directed to an apparatus and a method for erasing memory cells of a 3D-NAND memory device based on an algorithm that enables erasing the memory cells with a reduced erase time while maintaining wear performances of the memory cells.

In the present disclosure, a modified ISPE is provided. In the modified ISPE, after an erase pulse is applied to erase the memory cells, a first verifying operation can be performed on the memory cells by applying an enhanced erase verify level (also refer to enhanced erase verify voltage) EV+ to verify if the memory cells are erased successfully. The EV+ can be equal to an erase verify level (or erase verify voltage) EV plus a half of the ISPE step. When the memory cells fail the first verifying operation (e.g., not all the memory cells are erased), a first erase pulse can be applied to the memory cells to erase the memory cells again. The first erase pulse can be equal to the erase pulse plus the ISPE step. When the memory cells pass the first verifying operation based on enhanced erase verify level EV+, a second verifying operation can be performed based on the erase verify level EV. If the second verifying operation fails, a second erase pulse can be subsequently applied to the memory cells to erase the memory cells, where the second erase pulse can be equal to the erase pulse plus a half of the ISPE step.

Compared to the related examples, the methods (e.g., modified ISPE) in the disclosure can not only maintain an approximate same erase time (adding a verifying operation based on EV+) to the ISPE, but also prevent the deep erasure. Accordingly, the wear performances of the memory cell can be improved and the impact on the programming performances can be reduced. In the disclosure, the ISPE step (also referred to as or incremental voltage) can be greatly increased to shorten the erase time while maintaining same wear performances to the related examples. Moreover, when the erase time and erase depth are kept, the ISPE step can be doubled, thus the erase start voltage (e.g., a first erase pulse) can be reduced, and the wear performances of the memory cells can be improved.

According to an aspect of the present disclosure, a method for erasing a memory device including memory cells is provided. In the method, a first erase operation can be performed on a selected memory cell of the memory cells based on a first erase voltage. A first verifying operation can be performed on the selected memory cell based on a first erase verify voltage. A second verifying operation can be subsequently performed on the selected memory cell based on a second verify voltage after the selected memory cell passes the first verifying operation.

Further, a second erase operation can be performed on the selected memory cell based on a second erase voltage after the selected memory cell fails the second verifying operation.

In the method, the first erase verify voltage can be equal to the second erase verify voltage plus a first percent of an incremental voltage. The first percent can be larger than 10% and less than 90%. In an example, the first percent is equal to 50%.

In addition, the second erase voltage can be equal to the first erase voltage plus a second percent of the incremental voltage. The second percent can be larger than 10% and less than 90%. In an exemplary embodiment, the second percent is equal to 50%.

In some embodiments, a third erase operation can be performed on the selected memory cell based on a third erase voltage after the selected memory cell fails the first verifying operation, where the third erase voltage can be equal to the first erase voltage plus the incremental voltage.

In some embodiments, before the selected memory cell is erased by the first erase operation, a pre-program operation can be performed on the memory cells based on a programming voltage, where the pre-program operation is configured to narrow a threshold voltage distribution of the memory cells.

In the method, a third verifying operation can be performed on the selected memory cell based on the second erase verify voltage after the selected memory cell is erased by the second erase operation.

Moreover, a fourth verifying operation can be performed on the selected memory cell based on the first erase verify voltage after the selected memory cell is erased by the third erase operation.

According to another aspect of the disclosure, a device is provided. The device can include a voltage generator and a control logic circuitry. The voltage generator can be configured to generate erase voltages and erase verify voltages. The control logic circuitry can be configured to apply a first erase voltage generated by the voltage generator to a selected memory cell for a first erase operation. The control logic circuitry can be configured to compare a first erase verify voltage generated by the voltage generator with a threshold voltage of the selected memory cell for a first verifying operation. The control logic circuitry can further be configured to compare a second erase verify voltage generated by the voltage generator with the threshold voltage of the selected memory cell for a second verifying operation after the selected memory cell passes the first verifying operation.

In some embodiments, the control logic circuitry can be configured to apply a second erase voltage generated by the voltage generator to the selected memory cell for a second erase operation after the selected memory cell fails the second verifying operation.

In some embodiments, the control logic circuitry can be further configured to apply a third erase voltage generated by the voltage generator to the selected memory cell for a third erase operation after the selected memory cell fails the first verifying operation.

In the device, the first erase verify voltage can be equal to the second erase verify voltage plus a first percent of an incremental voltage. The second erase voltage can be equal to the first erase voltage plus a second percent of the incremental voltage and the third erase voltage can be equal to the first erase voltage plus the incremental voltage.

In some embodiments, the control logic circuitry can further be configured to compare the second erase verify voltage generated by the voltage generator with the threshold voltage of the selected memory cell for a third verifying operation after the selected memory cell is erased by the second erase operation.

In some embodiments, the control logic circuitry can further be configured to compare the first erase verify voltage generated by the voltage generator with the threshold voltage of the selected memory cell for a fourth verifying operation after the selected memory cell is erased by the third erase operation.

According to another aspect of the disclosure, a memory device that includes memory cells is provided, where the memory cells can include a selected memory cell. The memory device can include a voltage generator coupled to the memory cells and configured to generate erase voltages and erase verify voltages. The memory device can include sense amplifier and latch circuitry coupled to the memory cells and configured to sense voltage signals of the memory cells. The memory device can also include control logic circuitry.

The control logic circuitry can be configured to perform a first verifying operation on the selected memory cell based on first voltage signal of the selected memory cell sensed by the sense amplifier and latch circuitry. The first voltage signal can be generated by the control logic circuitry to apply a first erase verify voltage generated by the voltage generator on the selected memory cell. The selected memory cell can have previously been erased by a first erase operation based on a first erase voltage generated by the voltage generator. The control logic circuitry can be configured to perform a second verifying operation on the memory cells based on second voltage signal of the selected memory cell sensed by the sense amplifier and latch circuitry. The second voltage signal can be generated by the control logic circuitry to apply a second erase verify voltage generated by the voltage generator on the selected memory cell after the selected memory cell passes the first verifying operation. The control logic circuitry can further be configured to perform a second erase operation on the selected memory cell by applying a second erase voltage generated by the voltage generator after the selected memory cell fails the second verifying operation.

In some embodiments, the first erase verify voltage can be equal to the second erase verify voltage plus a first percent of an incremental voltage, and the second erase voltage can be equal to the first erase voltage plus a second percent of the incremental voltage.

In some embodiments, the control logic circuitry can further be configured to perform a third verifying operation on the selected memory cell based on third voltage signal of the selected memory cell sensed by the sense amplifier and latch circuitry. The third voltage signal can be generated by the control logic circuitry to apply the second erase verify voltage on the selected memory cell after the selected memory cell is erased by the second erase operation.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
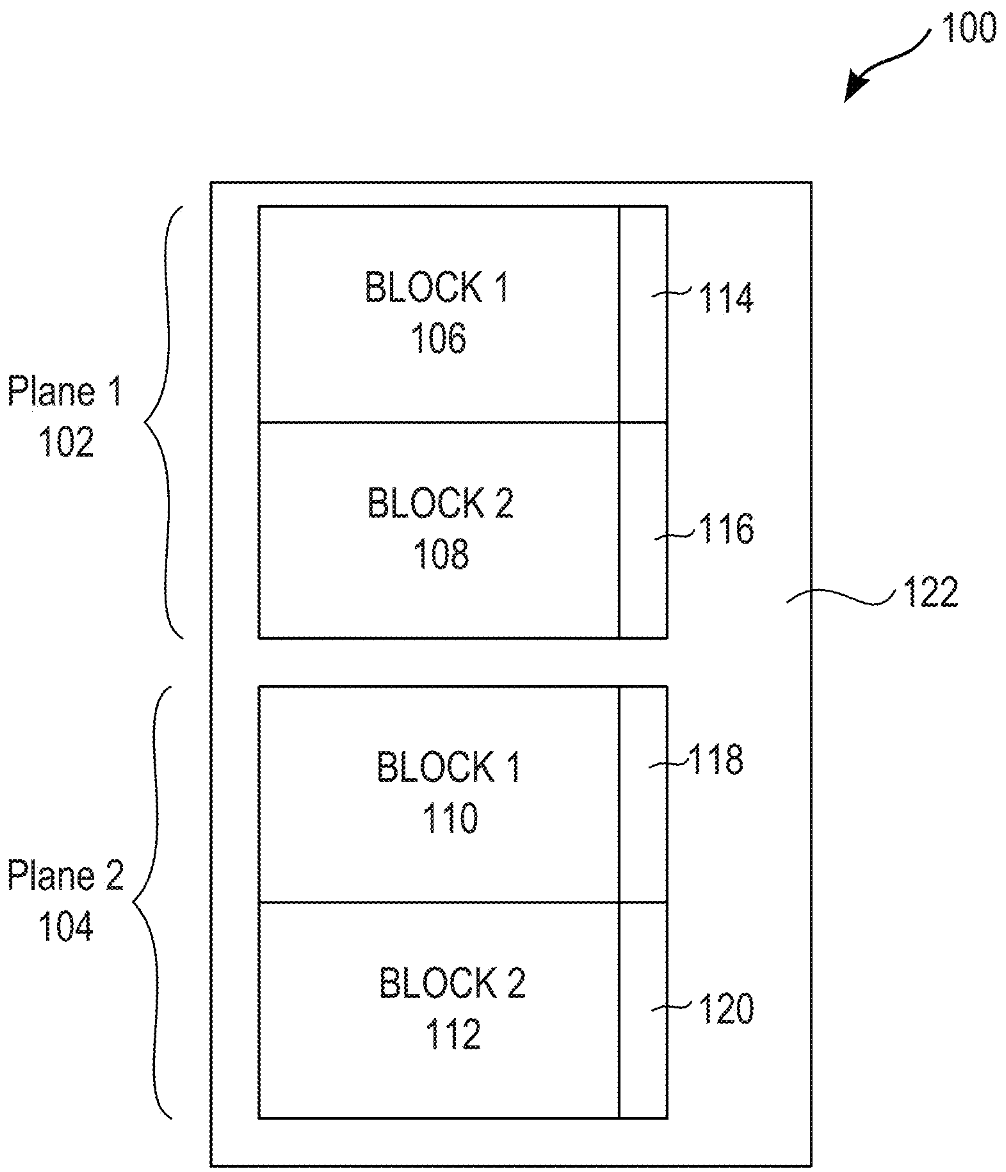
FIG. 1 is a schematic diagram of a 3D-NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D-NAND device can include a plurality of planes. Each of the planes can include a plurality of blocks. FIG. 1 is an exemplary embodiment of a 3D-NAND device 100 (or device 100). As shown in FIG. 1, the device 100 can include planes 102 and 104. Each of the planes 102 and 104 can include two respective blocks. For example, the plane 102 can include two blocks 106 and 108, and the plane 104 can include two blocks 110 and 112. Further, each of the blocks can include a plurality of memory cell strings, where memory cells are disposed sequentially and in series over a substrate along a height direction of the device 100. Of course, it should be noted that FIG. 1 is merely an example, and the device 100 can include any number of planes, and each of the planes can include any number of blocks according to the device designs.

In the device 100, each of the planes can be coupled to a respective cache structure, such as a dynamic data cache (DDC), or a static page buffer (SPB). For example, the block 106 can be coupled to a cache structure 114 and the block 108 can be coupled to a cache structure 116. The cache structure can include sense amplifiers that are coupled to bit lines and configured to sense signals during the operation of the 3D-NAND device 100, such as reading, programming, or erasing memory cells of the 3D-NAND device 100. The device 100 can also include periphery circuits 122 that can include decoder structures, driver structures, charge structures, and other structures to operate the memory cells.

Figure 2:
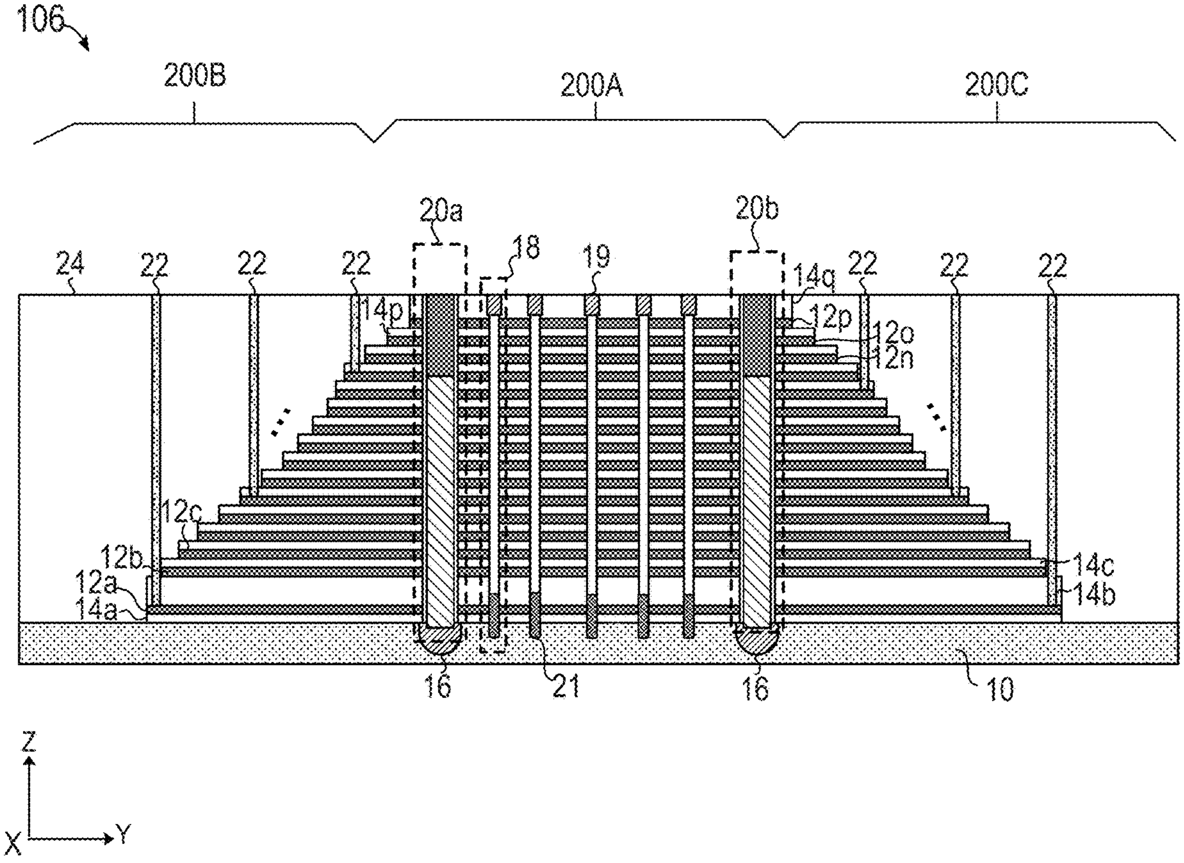
FIG. 2 is a cross-sectional view of a 3D-NAND memory device, in accordance with exemplary embodiments of the disclosure.

In the device 100, each of the blocks can include staircase regions and array regions that are formed in a stack of word line layers and insulating layers. FIG. 2 is an exemplary embodiment of the block 106 of the device 100. As shown in FIG. 2, the block 106 can include an array region 200A and staircase regions 200B-200C that are arranged in a dielectric layer 24. The array region 200A can be arranged between the staircase regions 200B-200C, and formed in a stack of alternating word line layers 12*a*-12*p* and insulating layers 14*a*-14*q* over a substrate 10. The word line layers 12*a*-12*p* can include one or more bottom select gate (BSG) layers, gate layers (or word line layers), and one or more top select gate (TSG) layers that are arranged sequentially over the substrate 10. For example, the word line layers 12*o*-12*p* can be the BSG layers, and the word line layers 12*a*-12*b* can be the TSG layers in the device 100.

The array region 200A can include a plurality of channel structures 18. Each of the channel structures 18 can include a respective top channel contact 19 and a respective bottom channel contact 21. Each of the channel structure 18 can extend through the stack and be coupled to the word line layers 12*a*-12*p* to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (e.g., Z direction) of the substrate 10. The one or more BSTs can be formed of the channel structure and the one or more BSG layers, the MCs can be formed of the channel structure and the word line layers, and the one or more TSTs can be formed of the channel structure and the one or more TSG layers.

In the device 100, each of the memory cells can store one or more logic bits, according to the device designs. For example, the memory cells can be single level cells (SLCs), multiple level cells (MLCs), or triple level cells (TLCs). Accordingly, each of the memory cells can store one logic bit, two logic bits, or three logic bits.

Still referring to FIG. 2, the word line layers 12*a*-12*p* can be formed in a stair-cased configuration in the staircase regions 200A-200B, and a plurality of word line contacts 22 can be formed along the height direction and coupled to the word line layers 12*a*-12*p*. Thus, gate voltages can be applied on gates of the memory cells through the word line contact 22 that is coupled to the word line layers 12*a*-12*p*.

In addition, each of the channel structures can further be coupled to a respective bit line (or bit line structure). In some embodiments, the bit line can be connected to the top channel contact 19 of the channel structure 18, and configured to apply a bias voltage when operating the channel structure, such as programming, erasing, or reading the channel structure. The device 100 can have a plurality of slit structures (or gate line slit structures). For example, two slit structures 20*a*-20*b* are included in FIG. 2. The slit structures 20*a*-20*b* can be made of conductive materials and positioned on array common source (ACS) regions 16 to serve as contacts. The ACS regions are formed in the substrate 10 to serve as common sources of the device 100.

Figure 3:
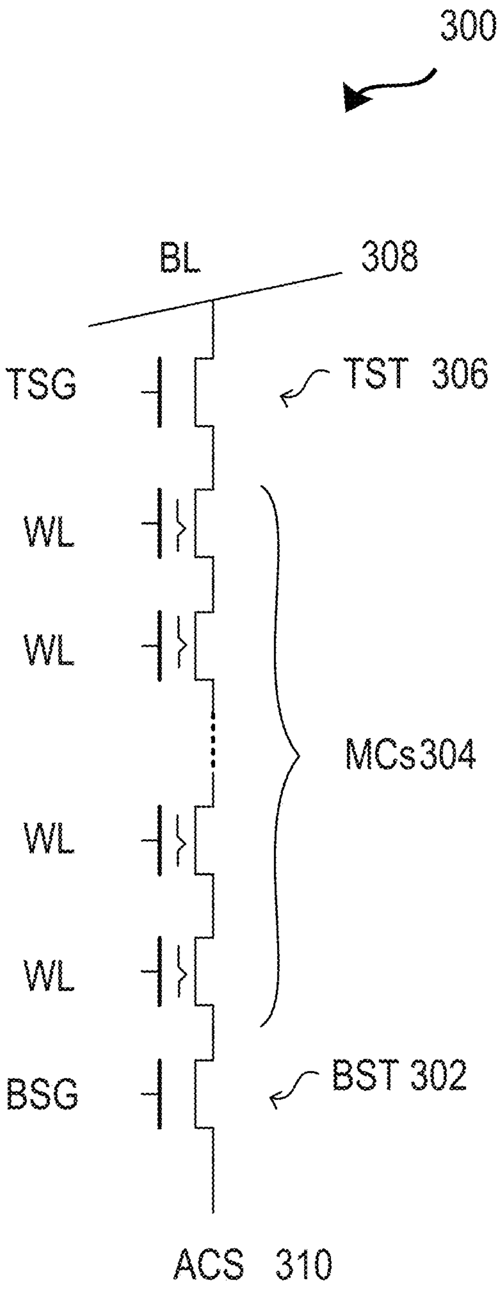
FIG. 3 is a schematic diagram of a NAND memory cell string, in accordance with exemplary embodiments of the disclosure.

FIG. 3 is a schematic view of a NAND memory cell string (or string) 300 that can be formed in the device 100. As shown in FIG. 3, the string 300 can include a bottom select transistor (BST) 302, a plurality of memory cells (MCs) 304, and a top select transistor (TST) 306 that are disposed sequentially and in series over the substrate along the height direction (e.g., Z direction) of the substrate 10. The string 300 can be coupled to a bit line 308 through a drain terminal of the TST 306, and coupled to an ACS 310 through a source terminal of the BST 302. During the operation of the device 100, appropriate voltages can be applied to the bit line 308, the gate of the TST 306 through the TSG layer, the gates of the MCs 304 through the WL layers, the gate of the BST 302 through the BSG layer, and the ACS 310 through the slit structure (e.g., 20*a* or 20*b*).

For example, in order to erase the memory cells 304, an erase voltage, such as 20 volts, can be applied to a P-type well (PW) that is positioned in the substrate 10. In addition, a bias voltage, such as 10~14 volts, can be applied to the gates of the BST 302 through the BSG layer and the TST 306 through the TSG layer to turn on the BST 302 and the TST 306. Further, the gates of the MCs 304 can be kept at a low voltage, such as zero volt. Thus, holes that are generated in the PW by the erase voltage can be injected to channel layers of the MCs 304, and electrons trapped in charge trapping layers of the MCs 304 can be attracted to the channel layers. The holes and the electrons can further be annihilated through a recombination process. Accordingly, the MCs 304 are erased when the electrons trapped in the charge trapping layers are annihilated through the recombination process.

In some embodiments, an erase verifying operation (or verifying operation) can be performed after the memory cells are erased to verify if the memory cells are erased successfully. In order to verify if the memory cells are erased successfully, an erase verify level (or erase verify voltage) EV, such as 0.7 volt, can be applied to the gates of the MCs 304 through the WL layers. If the MCs 304 are turned on based on the EV, a current can be detected to pass through the string 300 by sense amplifiers (e.g., 1018 in FIG. 9) that are coupled to the MCs 304. Thus, the MCs 304 are erased successfully. If no current is detected to pass through the string 300, it indicates that the MCs 304 are not erased successfully, and at least one of memory cell in the string 300 is not erased.

Figure 4:
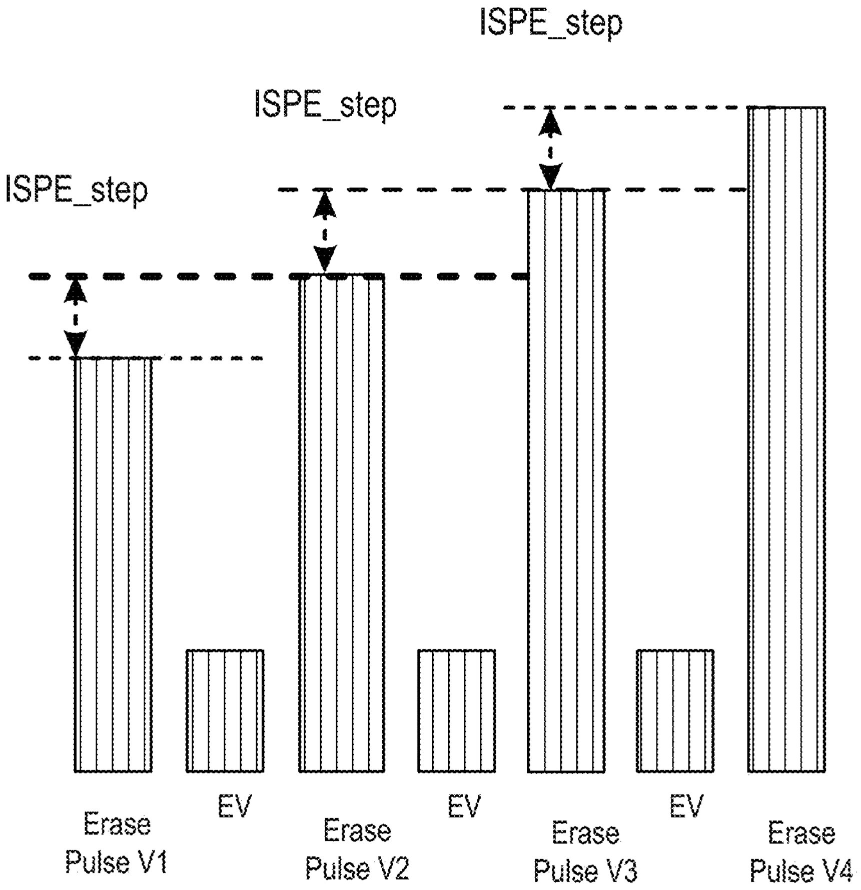
FIG. 4 is a schematic diagram of an incremental step pulse erase (ISPE), in accordance with exemplary embodiments of the disclosure.

FIG. 4 is a schematic diagram of an incremental step pulse erase (ISPE) that is applied to erase memory cells of a 3D-NAND memory device in a related example. According to the ISPE, in order to erase the memory cells of the 3D-NAND memory device (e.g., device 100), a plurality of erase pulses (or erase voltages), can be applied to a substrate (e.g., 10) of the memory cells (e.g., 304). The erase pulse can be increased gradually by an ISPE step (also referred to as an incremental voltage), where a later erase pulse is increased by the ISPE step compared to a prior erase pulse. In addition, an erase verifying operation (also referred to as verifying operation) can be conducted after each of the erase pulses. As shown in FIG. 4, in order to erase the memory cells of the 3D-NAND memory device, a first erase pulse V1 can be applied to the substrate of the memory cells to perform a first erase operation. A first erase verifying operation can be operated after the first erase operation based on an erase verify level (or erase verify voltage) EV. If the memory cells fail the first erase verifying operation, a second erase pulse V2 can be applied to the substrate of the memory cells to perform a second erase operation, where the second erase pulse V2 is equal to the first erase pulse V1 plus the ISPE step. Subsequently, a second erase verifying operation can be operated after the second erase operation based on the EV. According to the ISPE, the erase operation and the erase verifying operation can be continued in remaining erase pulses (e.g., V3, V4) and remaining erase verifying levels EV respectively until the memory cells pass the erase verifying operation finally.

In some embodiments, the ISPE step (or incremental voltage) shown in FIG. 4 can be in a range between 0.1 volt and two volts.

Figure 5:
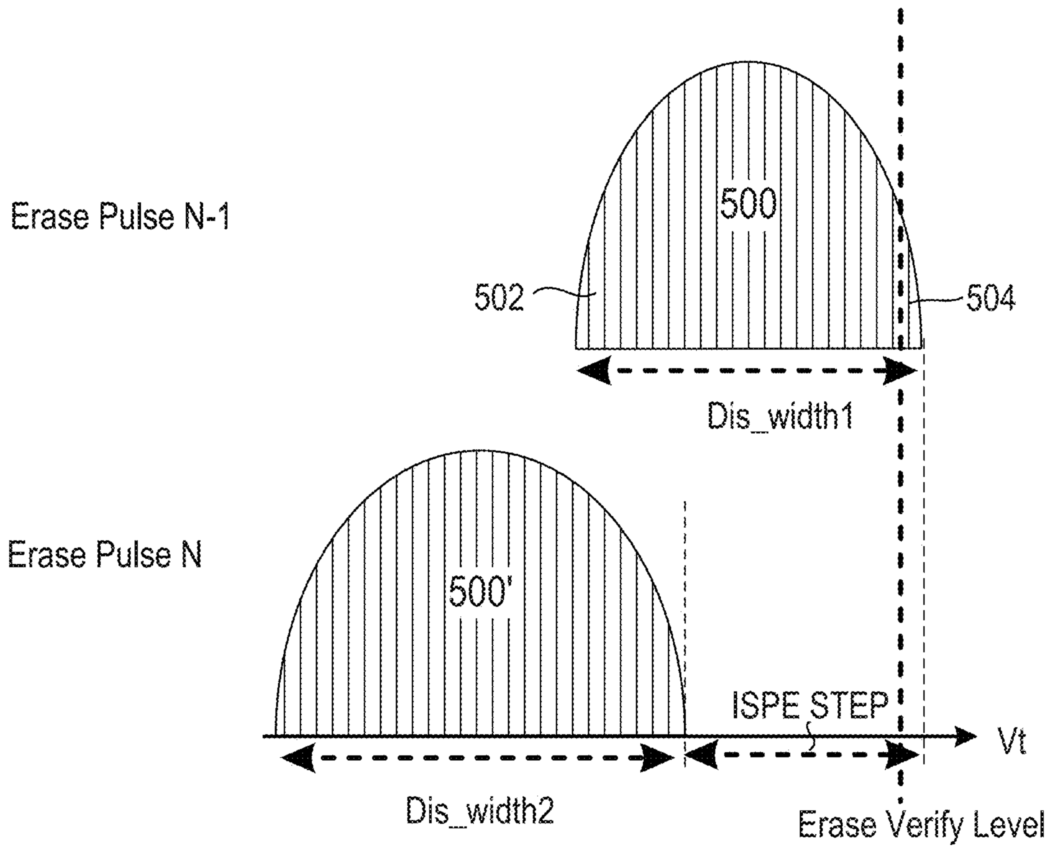
FIG. 5 is schematic diagram of a distribution of erase voltages for the ISPE, in accordance with exemplary embodiments of the disclosure.

FIG. 5 is a schematic diagram of a distribution of erase voltages in the ISPE. As shown in FIG. 5, threshold voltages of the memory cells can have a distribution 500 that can follow a bell or Gaussian distribution due to manufacturing process variations. The memory cells can receive a first erase operation N−1 based on a first erase pulse. When the first erase operation N−1 is completed, a first portion 502 of the threshold voltages in the distribution 500 is less than the erase verify level EV, which can indicate memory cells corresponding to the first portion 502 of the threshold voltages in the distribution 500 pass an erase verifying operation based on the EV. However, a second portion 504 of the threshold voltages in the distribution 500 of the memory cells is still larger than the erase verify level, which can indicate memory cells corresponding to the second portion 504 of the threshold voltages in the distribution 500 fail the erase verifying operation.

Thus, a second erase operation can be operated based on a second erase pulse, where the second erase pulse can be increased by the ISPE step comparing to the first erase pulse. When the second erase operation is completed, the threshold voltages of the memory cells can be less than the erase verify level, which indicates that all the memory cells are erased successfully. It should be noted that when the second erase operation is completed, the threshold voltages of the memory cells can have a distribution 500' that can be wider than the distribution 500. For example, as shown in FIG. 5, the distribution 500' can have a distribution width Dis_width2, and the distribution 500 can have a distribution width Dis_width1. The distribution width Dis_width2 is larger than the Dis_width1.

Figure 6:
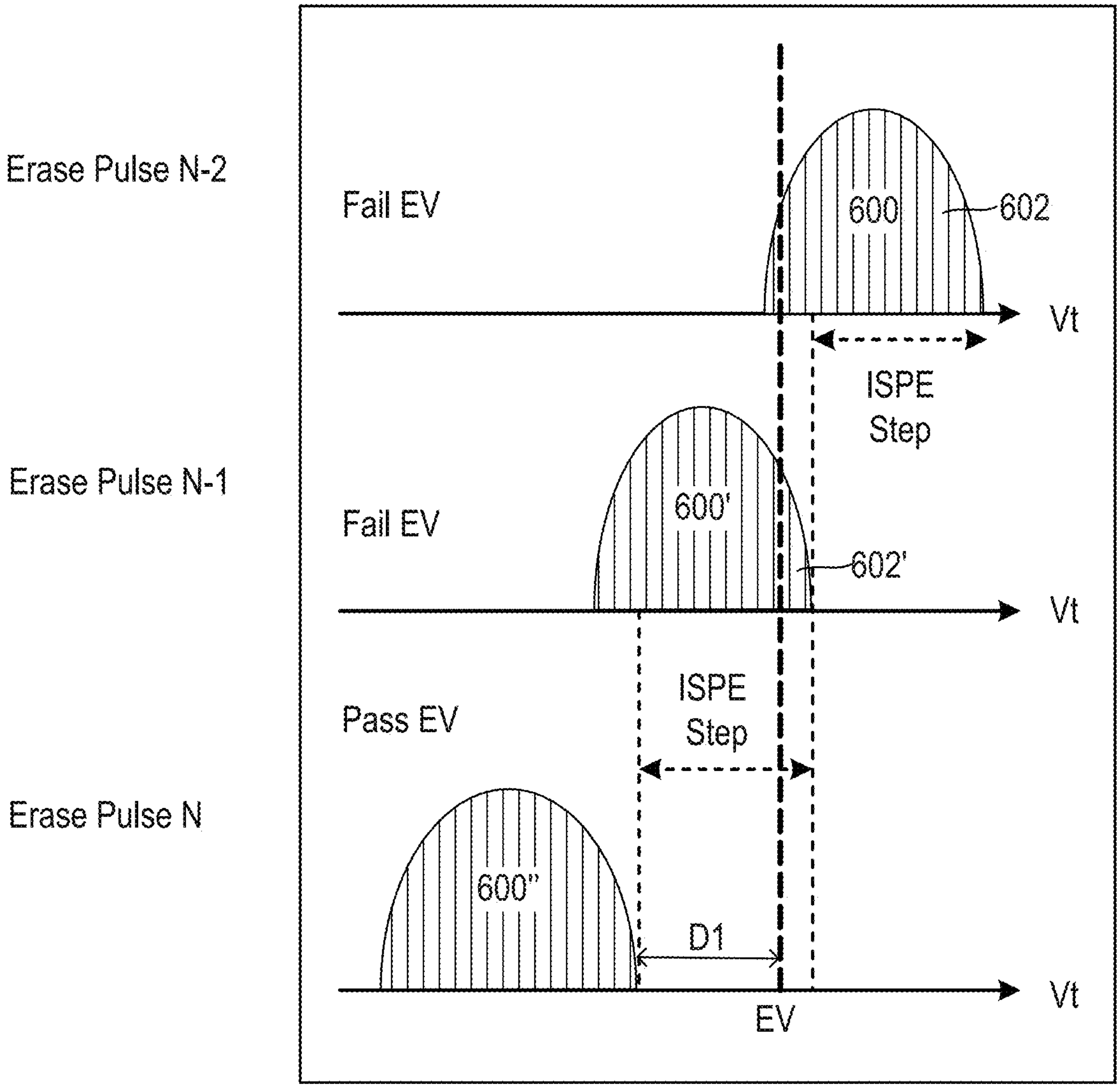
FIG. 6 is a schematic diagram of an erasing method in a related example, in accordance with exemplary embodiments of the disclosure.

FIG. 6 is a schematic diagram of erasing memory cells based on the ISPE in a related example. As shown in FIG. 6, a first erase operation can be performed to erase the memory cells by applying a first erase pulse N−2 to the memory cells. After the first erase operation, threshold voltages of the memory cells can have a distribution 600. A first erase verifying operation can be performed subsequently. In an exemplary embodiment of FIG. 6, after the first erase operation is conducted, most of the threshold voltages 602 in the distribution 600 are still larger than the erase verify level EV, which indicates that the memory cells can fail the first erase verifying operation. Thus, a second erase pulse N−1 can be applied to perform a second erase operation. The second erase pulse N−1 can be equal to the first erase pulse N−2 plus the ISPE step.

After the second erase operation, the threshold voltages of the memory cells can have a distribution 600'. A second erase verifying operation can be subsequently performed to verify if the memory cells are all erased successfully. When the second erase verifying operation shows that a portion 602' of the threshold voltages in the distribution 600' is still larger than the EV, a third erase pulse N can be applied to perform a third erase operation. After the third erase operation, the threshold voltages of the memory cells can have a distribution 600". The third erase pulse N can be increased by the ISPE step compared to the second erase pulse N−1. Further, a third erase verifying operation can be subsequently applied. In an exemplary embodiment of FIG. 6, the third erase verifying operation shows that the threshold voltages in the distribution 600" are all less than the EV, which indicates that the memory cells are erased successfully.

It should be noted that the ISPE in the related example can result in a wider distribution of threshold voltages after a number of erase operations. For example, as shown in FIG. 6, when the memory cells receive the third erase operation, the threshold voltages (Vt) of the memory cells can have a distribution 600", which can be wider than the distribution of the threshold voltages 600 that is formed when the memory cells receive the first erase operation. A wider distribution of the threshold voltage can result in more programming pulses and longer verification time during programming the memory cells, which can lead to longer programming time.

Figure 7:
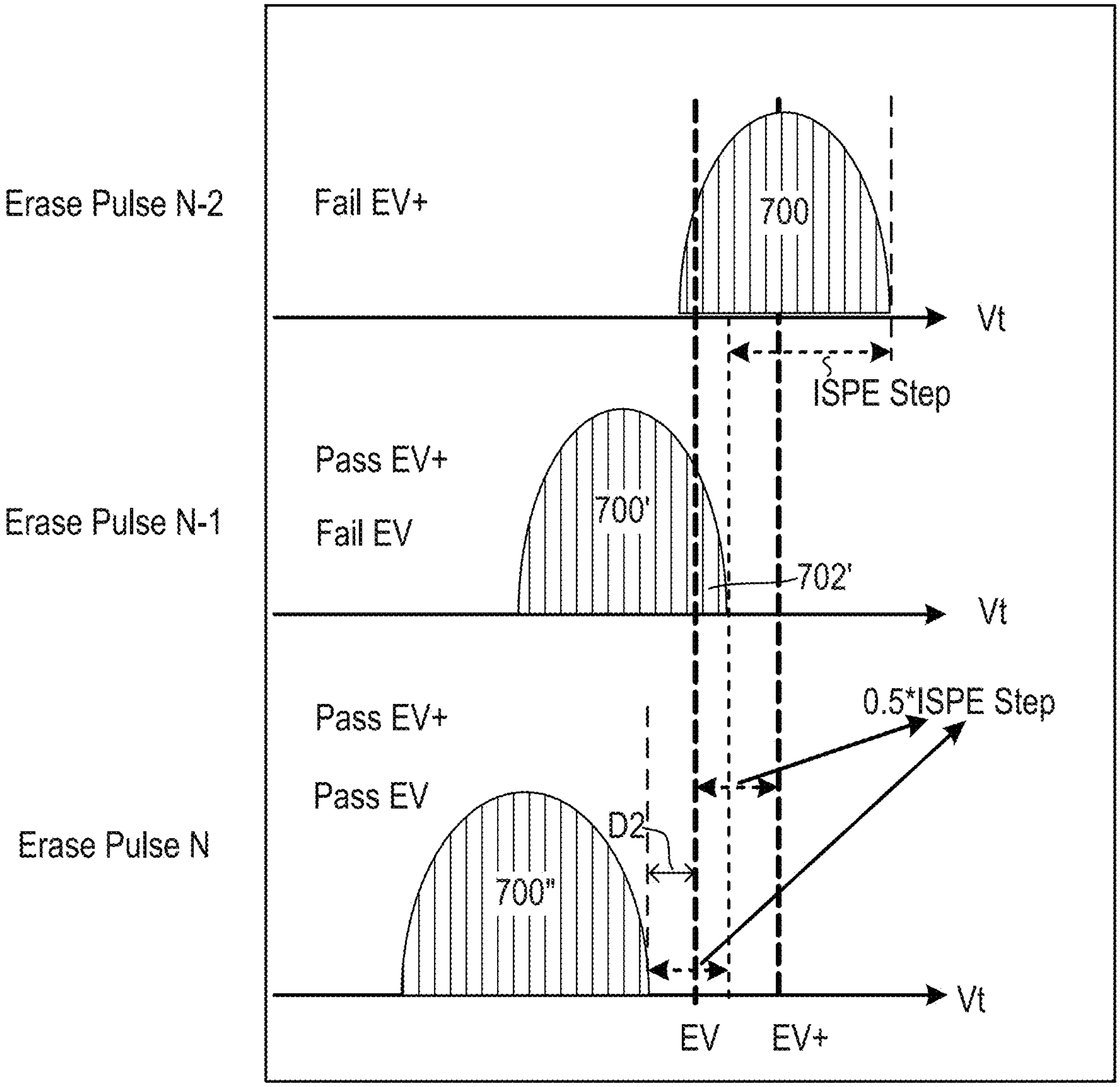
FIG. 7 is a schematic diagram of a disclosed erasing method, in accordance with exemplary embodiments of the disclosure.

FIG. 7 shows a schematic diagram of erasing memory cells based on the methods (e.g., modified ISPE) in the present disclosure. As shown in FIG. 7, a first erase operation can be performed to erase the memory cells by applying a first erase pulse N−2 to the memory cells. After the first erase operation, threshold voltages of the memory cells can have a distribution 700. A first erase verifying operation can be performed subsequently based on an enhanced erase verify level EV+. In some embodiments, the EV+ can be equal to the EV plus a first percent of the ISPE step. In an embodiment, the first percent can be larger than 0% and less than 100%. In another embodiment, the first percent can be larger than 10% and less than 90%. For example, the first percent can be equal to 50%. In an exemplary embodiment of FIG. 7, the first erase verifying operation can indicate that the memory cells fail the erase verification because almost a half of the threshold voltages in the distribution 700 are still larger than the EV+. Thus, a second erase pulse N−1 can be applied to perform a second erase operation. The second erase pulse N−1 can be equal to the first erase pulse N−2 plus the ISPE step.

After the second erase operation, the threshold voltages of the memory cells can have a distribution 700'. A first erase verifying operation based on the erase verify level EV+ can be performed to verify whether the memory cells are erased successfully after the second erase operation. In an exemplary embodiment of FIG. 7, the memory cells pass the first erase verifying operation based on EV+. Thus, a second erase verifying operation can be performed subsequently according to the erase verify level EV. In an exemplary embodiment of FIG. 7, the threshold voltages in the distribution 700' can be less than the EV+, but a portion 702' of the threshold voltages 700' can still be more than the EV. Thus, the memory cells pass the first erase verifying operation based on EV+, but fail the second erase verifying operation based on EV.

In another embodiment of FIG. 7, a first erase operation can be performed to erase the memory cells by applying a first erase pulse N−1 to the memory cells, where the threshold voltages of the memory cells can have a distribution 700'. A first erase verifying operation can be performed subsequently based on the enhanced erase verify level EV+. When the memory cells pass the first erase verifying operation based on the EV+ (e.g., the threshold voltages of the memory cells are less than the EV+), a second erase verifying operation can be performed on the memory cell based on the EV. When the memory cells fail the second erase verifying operation (e.g., at least a portion 702' of the threshold voltages in the distribution 700' is larger than the EV), a second erase operation can be performed on the memory cells based on a second erase pulse N.

After the second erase operation, the threshold voltages of the memory cells can have a distribution 700". In an example, the second erase pulse N can be equal to the first erase pulse N−1 plus a second percent of the ISPE step. The second percent can be larger than 0% and less than 100%. In an exemplary embodiment of FIG. 7, the second percent is 50%. Further, a third erase verifying operation can be subsequently applied to the memory cells. In an exemplary embodiment of FIG. 7, the third erase verifying operation shows that all the threshold voltages in the distribution 700" are less than the EV, which indicates that the memory cells are erased successfully.

Compared to FIG. 6 and FIG. 7, the methods of the present disclosure can gain a smaller erase depth than the ISPE. The erase depth can be defined by a voltage distance between the EV and a right boundary of the threshold voltage distribution. For example, the ISPE shown in FIG. 6 can have an erase depth D1 that is larger than an erase depth D2 in the disclosed methods in FIG. 7. A larger erase depth can indicate a deep erasure, and deteriorate wear performances and reliabilities of the memory cells.

Figure 8:
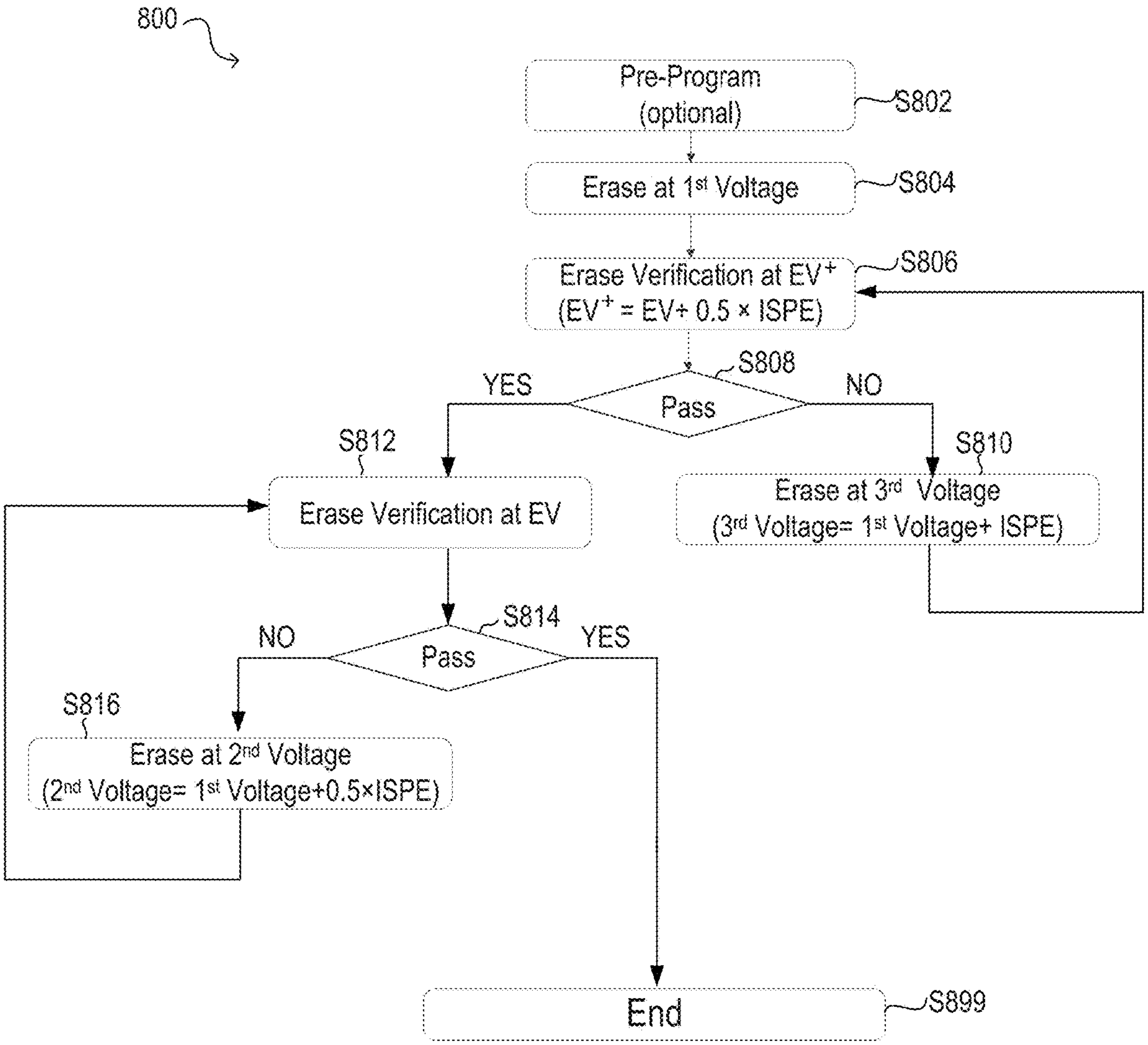
FIG. 8 is a flow chart diagram of a method for erasing memory cells, in accordance with exemplary embodiments of the disclosure.

FIG. 8 is a flow chart diagram of a method 800 for erasing memory cells, in accordance with exemplary embodiments of the disclosure. As shown in FIG. 8, the method 800 can start at S802 where a pre-program operation can be performed. The pre-program operation can be an optional step and configured to program memory cells of a 3D-NAND memory device by applying a weak programming pulse on WL layers of the memory cells. The pre-program operation can be configured to narrow a distribution of threshold voltages of the memory cells.

At S804, the memory cells can be erased by a first erase operation based on a first erase voltage. At S806, a first verifying operation can be performed on the memory cells based on an enhanced erase verify voltage. In some embodiments, the enhanced erase verify voltage can be equal to an erase verify voltage plus a first percent of a first incremental voltage (or first ISPE step). In some embodiments, the first ISPE step can be in a range from 0.1 volts to 2 volts. In some embodiments, the first percent can be larger than 0% and less than 100%. In some embodiments, the first percent can be larger than 10% and less than 90%. For example, the first percent is equal to 50%.

The method 800 then proceeds to S808. At S808, whether the memory cells pass the first verifying operation can be determined based on signals collected through the first verifying operation. In response to the memory cells passing the first verifying operation, the method 800 can proceed to S812, where a second verifying operation can be performed on the memory cells based on the erase verify voltage EV. At S814, whether the memory cells pass the second verifying operation can be determined based on signals collected through the second verifying operation. In an embodiment, in response to the memory cells passing the second verifying operation, the method 800 can proceed to S899 which indicates that the memory cells are erased successfully. In another embodiment, in response to the memory cells failing the second verifying operation, the method 800 can process to S816, where a second erase operation can be performed on the memory cells based on a second erase voltage. In an example of FIG. 8, the second erase voltage can be equal to the first erase voltage plus a second percent of a second incremental voltage (or second ISPE step). In some embodiments, the second ISPE step can be in a range from 0.1 volts to 2 volts. In an embodiment, the first ISPE step can be equal to the second ISPE step. In another embodiment, the first ISPE step can be different to the second ISPE step. In some embodiments, the second percent can be larger than 0% and less than 100%. In some embodiments, the second percent can be larger than 10% and less than 90%. For example, the second percent can be 50%. Further, the method 800 can then proceed back to S812 to perform an erase verifying operation based on the erase verify voltage EV.

Still referring to FIG. 8, as shown at S808, when the memory cells fail the first verifying operation, the method 800 process can proceed to S810, where a third erase operation can be performed on the memory cells based on a third erase voltage. The third erase voltage can be equal to the first erase voltage plus the first incremental voltage (or first ISPE step). Further, the method 800 can proceed back to S806 to perform an erase verifying operation based on the enhanced erase verify voltage EV+.

Figure 9:
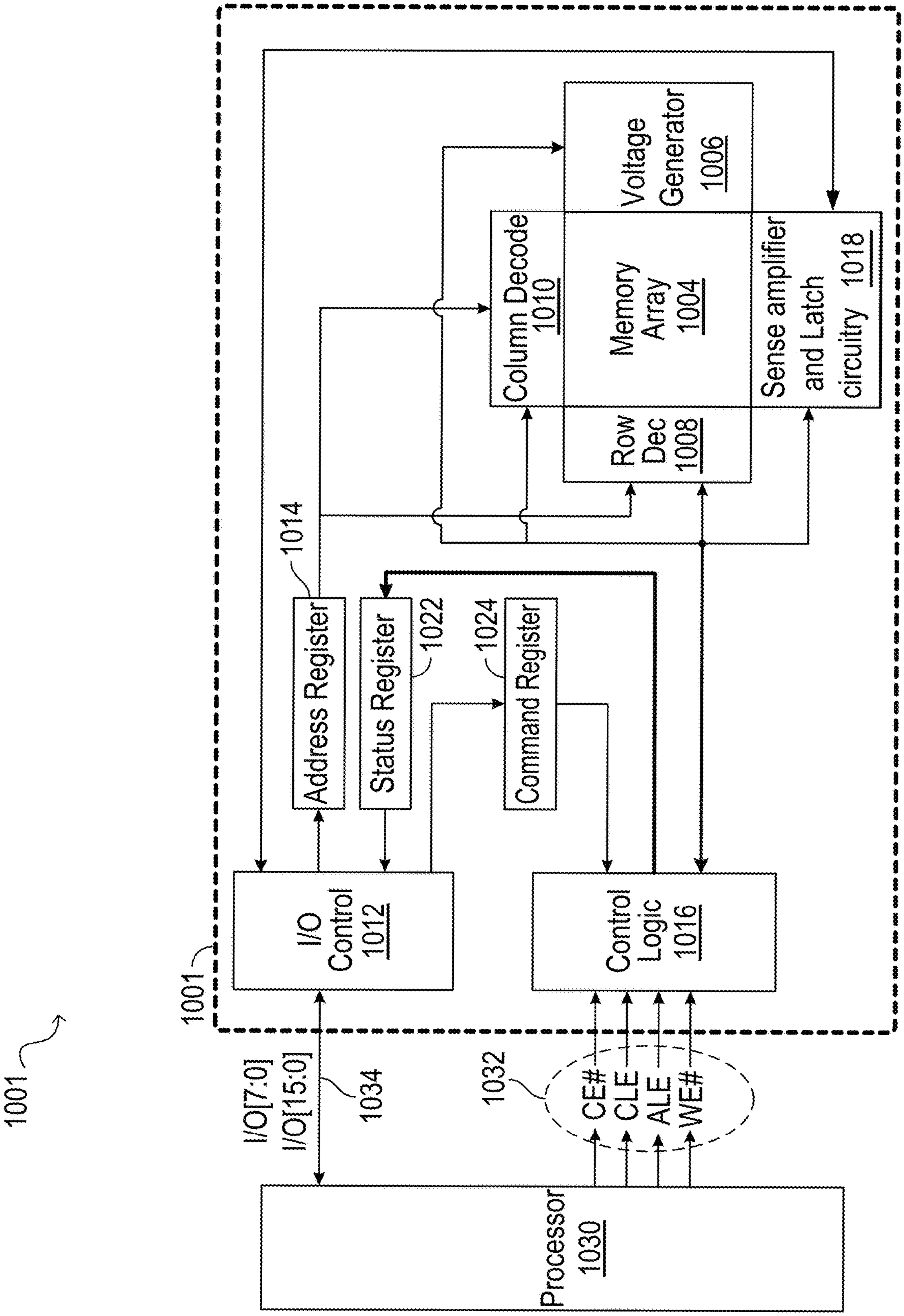
FIG. 9 is a block schematic of an electronic system, in accordance with exemplary embodiments of the disclosure.

FIG. 9 is a simplified block diagram of a memory device 1001 according to an embodiment of the disclosure, and on which various embodiments of the disclosure can be implemented. The memory device 1001 can include a memory array 1004 arranged in rows and columns. The memory array 1004 can include memory cells (e.g., MCs 304 in FIG. 3) that are formed based on a plurality of channel structures (e.g., channel structures 18 in FIG. 2). The channel structures can be formed in a stack of alternating word line layers (e.g., 12 in FIG. 2) and insulating layers (e.g., 14 in FIG. 2). A row decode circuit 1008 and a column decode circuit 1010 are provided to decode address signals provided to the memory device 1001. Address signals are received and decoded to access the memory array 1004. Memory device 1001 can also include an input/output (I/O) control circuit 1012 to manage input of commands, addresses and data to the memory device 1001 as well as output of data and status information from the memory device 1001. An address register 1014 is coupled between the I/O control circuit 1012 and the row decode circuit 1008 and column decode circuit 1010 to latch the address signals prior to decoding. A command register 1024 is coupled between the I/O control circuit 1012 and a control logic (also referred to as control logic circuitry) 1016 to latch incoming commands from an external processor 1030.

The memory device 1001 can include a voltage generator 1006 that is coupled to the memory array 1004 and the control logic 1016. The voltage generator 1006 is configured to generate voltages of suitable levels for the proper operations of the memory device 1001. For example, in order to erase memory cells of the memory device 1001, the voltage generator 1006 can generate appropriate bias voltages that are applied on P-type wells and gates of the memory cells according to control signals of the control logic 1016. The memory device 1001 can also include sense amplifier and latch circuitry 1018 configured to sense signals of the memory cells during the operation of the memory device 1001. The signals can be voltage signals that indicate switch statuses (e.g., on or off) of the memory cells. The sense amplifier and latch circuitry 1018 can further be configured to latch data, either incoming or outgoing.

The control logic 1006 can further operate a verify operation to verify if the memory cells are erased successfully. In the verify operation, the control logic 1006 can compare an erase verify voltage generated by the voltage generator 1006 with threshold voltages of the erased memory cells that can be sensed by the sense amplifier and latch circuitry 1018 to determine if the memory cells are erased successfully. For example, when the memory cells are eased successfully, the threshold voltages of the erased memory cells can be lower than the erase verify voltage.

The control logic 1016 can control access to the memory array 1004 in response to the commands of the external processor 1030 and generate status information for the external processor 1030. For example, in response to an erase command from the external processor 1030, the control logic 1016 can cause access to the memory array 1004 according to, for example, the method 800 to erase the memory array 1004. Thus, the control logic 1016 can apply appropriate bias voltages on the memory cells through the voltage generator 1006 and further verify the threshold voltages of the memory cells sensed by the sense amplifier and latch circuitry 1018 after the erase operation. The control logic 1016 is coupled to the row decode circuit 1008 and the column decode circuit 1010 to control the row decode circuit 1008 and column decode circuit 1010 in response to the addresses. The control logic 1016 can further be coupled to the voltage generator 1006 to control the voltage generator 1006 according to the commands of external processor 1030. Thus, appropriate bias voltages can be generated by the voltage generator 1006 according to the control signals of the control logic 1016, and further be applied to selected memory cells by the control logic 1016 through the row decode circuit 1008 and column decode circuit 1010 to operate the selected memory cells, such as reading, writing or erasing the memory cells. The control logic 1016 can be also coupled to sense amplifier and latch circuitry 1018 to control the sense amplifier and latch circuitry 1018 in response to the commands and generate status information for the external processor 1030. The sense amplifier and latch circuitry 1018 can be coupled to the memory array 1004 and can latch data, either incoming or outgoing, in the form of analog voltage levels. The sense amplifier and latch circuitry 1018 can be configured to read signals of the memory cells when the memory cells are operated.

Still referring to FIG. 9, a status register 1022 can be coupled between the I/O control circuit 1012 and the control logic 1016 to latch the status information for output to the external processor 1030. The memory device 1001 receives control signals at control logic 1016 over a control link 1032. The control signals may include a chip enable CE #, a command latch enable CLE, an address latch enable ALE, and a write enable WE #. The memory device 1001 may receive commands in the form of command signals, addresses in the form of address signals, and data in the form of data signals from an external processor over a multiplexed input/output (I/O) bus 1034 and output data to the external processor over the I/O bus 1034.

The various embodiments described herein offer several advantages over methods in related examples to erase memory cells of a 3D-NAND memory device. In related examples, an incremental step pulse erase (ISPE) can be applied to erase the memory cells of the 3D-NAND flash memory device. The ISPE can cause a deep erasure which in turn deteriorates wear performances and reliabilities of the memory cells. In the present disclosure, a modified ISPE is provided. Comparing to the methods in the related example, the methods in the present disclosure can maintain an approximate same erase time to the ISPE, and prevent the deep erasure, which improves the wear performances of the memory cell and reduces the impact on the programming performances.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of erasing a memory device including memory cells, comprising:

performing a first erase operation on a selected memory cell of the memory cells;

performing a first erase verifying operation on the selected memory cell;

in response to the selected memory cell passing the first erase verifying operation, before performing another erase operation on the selected memory cell, performing a second erase verifying operation on the selected memory cell, wherein the first erase verifying operation and the second erase verifying operation are performed using different erase verify voltages; and performing a second erase operation on the selected memory cell based on results of the first erase verifying operation and the second erase verifying operation.

2. The method of claim 1, wherein the first erase verifying operation and the second erase verifying operation are configured to determine a threshold voltage distribution of the selected memory cell after the first erase operation.

3. The method of claim 2, wherein:

a first threshold voltage of the selected memory cell that fails the first erase verifying operation is larger than a second threshold voltage of the selected memory cell that passes the first erase verifying operation and fails the second erase verifying operation, and the second threshold voltage is larger than a third threshold voltage of the selected memory cell that passes the second erase verifying operation.

4. The method of claim 1, wherein the first erase operation is performed based on a first erase voltage and the second erase operation is performed based on a second erase voltage, and the second erase voltage is larger than the first erase voltage.

5. The method of claim 4, wherein based on the selected memory cell passing the first erase verifying operation and failing the second erase verifying operation, the second erase voltage is equal to the first erase voltage plus a first incremental voltage.

6. The method of claim 5, wherein, based on the selected memory cell failing the first erase verifying operation, the second erase voltage is equal to the first erase voltage plus a second incremental voltage.

7. The method of claim 6, wherein the first incremental voltage is lower than the second incremental voltage.

8. The method of claim 6, wherein the first incremental voltage is 10 percent to 90 percent of the second incremental voltage.

9. The method of claim 1, wherein the second erase operation is performed based on the selected memory cell failing one of the first erase verifying operation and the second erase verifying operation.

10. The method of claim 1, wherein the selected memory cell is erased successfully based on the selected memory cell passing the second erase verifying operation.

11. A memory device, comprising:

memory cells including a selected memory cell; and a periphery circuit configured to:

perform a first erase operation on the selected memory cell;

perform a first erase verifying operation on the selected memory cell;

in response to the selected memory cell passing the first erase verifying operation, before performing another erase operation on the selected memory cell, perform a second erase verifying operation on the selected memory cell, wherein the first erase verifying operation and the second erase verifying operation are performed using different erase verify voltages; and perform a second erase operation on the selected memory cell based on results of the first erase verifying operation and the second erase verifying operation.

12. The memory device of claim 11, wherein the first erase verifying operation and the second erase verifying operation are configured to determine a threshold voltage distribution of the selected memory cell after the first erase operation.

13. The memory device of claim 12, wherein:

a first threshold voltage of the selected memory cell that fails the first erase verifying operation is larger than a second threshold voltage of the selected memory cell that passes the first erase verifying operation and fails the second erase verifying operation, and the second threshold voltage is larger than a third threshold voltage of the selected memory cell that passes the second erase verifying operation.

14. The memory device of claim 11, wherein the first erase operation is performed based on a first erase voltage and the second erase operation is performed based on a second erase voltage, and the second erase voltage is larger than the first erase voltage.

15. The memory device of claim 14, wherein based on the selected memory cell passing the first erase verifying operation and failing the second erase verifying operation, the second erase voltage is equal to the first erase voltage plus a first incremental voltage.

16. The memory device of claim 15, wherein, based on the selected memory cell failing the first erase verifying operation, the second erase voltage is equal to the first erase voltage plus a second incremental voltage.

17. The memory device of claim 16, wherein the first incremental voltage is lower than the second incremental voltage.

18. The memory device of claim 11, wherein the second erase operation is performed based on the selected memory cell failing one of the first erase verifying operation and the second erase verifying operation.

19. The memory device of claim 11, wherein the selected memory cell is erased successfully based on the selected memory cell passing the second erase verifying operation.

20. A system, comprising:

a memory device including:

memory cells including a selected memory cell; and a periphery circuit configured to:

perform a first erase operation on the selected memory cell;

perform a first erase verifying operation on the selected memory cell;

in response to the selected memory cell passing the first erase verifying operation, before performing another erase operation on the selected memory cell, perform a second erase verifying operation on the selected memory cell, wherein the first erase verifying operation and the second erase verifying operation are performed using different erase verify voltages; and perform a second erase operation on the selected memory cell based on results of the first erase verifying operation and the second erase verifying operation; and a processor coupled to the memory device and configured to send a command to the memory device.

* * * * *